US012622309B2

(12) United States Patent
Tang et al.

(10) Patent No.: US 12,622,309 B2
(45) Date of Patent: May 5, 2026

(54) PLATINUM-BASED SOLDER BODY CONTACTS FOR INTEGRATION OF A FIRST SUBSTRATE WITH A SECOND SUBSTRATE

(71) Applicant: Newport Fab. LLC, Newport Beach, CA (US)

(72) Inventors: Zhirong Tang, Lake Oswego, OR (US); Edward Preisler, San Clemente, CA (US)

(73) Assignee: Newport Fab, LLC, Newport Beach, CA (US)

( * ) Notice: Subject to any disclaimer, the term of this patent is extended or adjusted under 35 U.S.C. 154(b) by 423 days.

(21) Appl. No.: 18/375,687

(22) Filed: Oct. 2, 2023

(65) Prior Publication Data

US 2024/0128213 A1 Apr. 18, 2024

Related U.S. Application Data

(63) Continuation-in-part of application No. 17/967,107, filed on Oct. 17, 2022, now Pat. No. 12,456,701.

(51) Int. Cl.
H01L 23/00 (2006.01)

(52) U.S. Cl.
CPC .............. H01L 24/05 (2013.01); H01L 24/03 (2013.01); H01L 24/11 (2013.01); H01L 24/13 (2013.01); *H01L 2224/02215* (2013.01); *H01L 2224/03* (2013.01); *H01L 2224/05124* (2013.01); *H01L 2224/05147* (2013.01); *H01L 2224/05181* (2013.01); *H01L 2224/05681* (2013.01); *H01L 2224/11* (2013.01); *H01L 2224/13169* (2013.01)

(58) Field of Classification Search
CPC ......... H01L 24/05; H01L 24/03; H01L 24/11; H01L 24/13; H01L 2224/02215; H01L 2224/03; H01L 2224/11
See application file for complete search history.

(56) References Cited

U.S. PATENT DOCUMENTS

| | | | | |
|---|---|---|---|---|
| 8,659,155 B2* | 2/2014 | Cheng | ..................... | H01L 24/11 |
| | | | | 257/737 |
| 9,084,378 B2* | 7/2015 | Arvin | .................... | H05K 3/4007 |
| 9,761,542 B1* | 9/2017 | Sylvestre | .............. | H01L 23/562 |
| 10,522,491 B2* | 12/2019 | Hsiao | ...................... | H01L 24/11 |
| 10,649,137 B1* | 5/2020 | Preisler | ................ | G02B 6/136 |
| 11,121,101 B2* | 9/2021 | Arvin | .................... | H01L 24/03 |
| 2006/0017171 A1* | 1/2006 | Weng | ...................... | H01L 24/05 |
| | | | | 257/734 |

(Continued)

*Primary Examiner* — Douglas W Owens

(74) *Attorney, Agent, or Firm* — Farjami & Farjami LLP

(57) ABSTRACT

One exemplary method of forming a semiconductor structure having a platinum-based solder body contact includes providing a semiconductor structure having a passivation layer over a surface thereof, the passivation layer having a window exposing a portion of a top metal pad, and forming a barrier metal stack over the passivation layer and the portion of the top metal pad, the barrier metal stack including a tantalum nitride (TaN) layer and a tantalum (Ta) layer. The method further includes forming a solder body contact layer comprising platinum (Pt) over the barrier metal stack, and patterning the solder body contact layer and the barrier metal stack to form the platinum-based solder body contact over the portion of the top metal pad.

20 Claims, 12 Drawing Sheets

(56)                References Cited

U.S. PATENT DOCUMENTS

| | | | | |
|---|---|---|---|---|
| 2011/0101527 A1* | 5/2011 | Cheng | .................... | H01L 24/11 |
| | | | | 257/737 |
| 2011/0233793 A1* | 9/2011 | Miura | ................. | B23K 1/0016 |
| | | | | 228/208 |
| 2011/0254151 A1* | 10/2011 | Lin | .................... | C23C 18/1605 |
| | | | | 257/737 |
| 2011/0260316 A1* | 10/2011 | Jang | ................... | H01L 21/4853 |
| | | | | 257/737 |
| 2012/0326298 A1* | 12/2012 | Lu | .......................... | H01L 24/03 |
| | | | | 257/737 |
| 2013/0187277 A1* | 7/2013 | Chen | ...................... | H01L 24/13 |
| | | | | 257/762 |
| 2014/0342546 A1* | 11/2014 | Hwang | .................. | H01L 24/11 |
| | | | | 438/614 |
| 2018/0247907 A1* | 8/2018 | Hsiao | ...................... | H01L 24/11 |
| 2019/0067200 A1* | 2/2019 | Kao | ...................... | H01L 23/481 |
| 2024/0105654 A1* | 3/2024 | Chuang | .................. | H01L 24/11 |

* cited by examiner

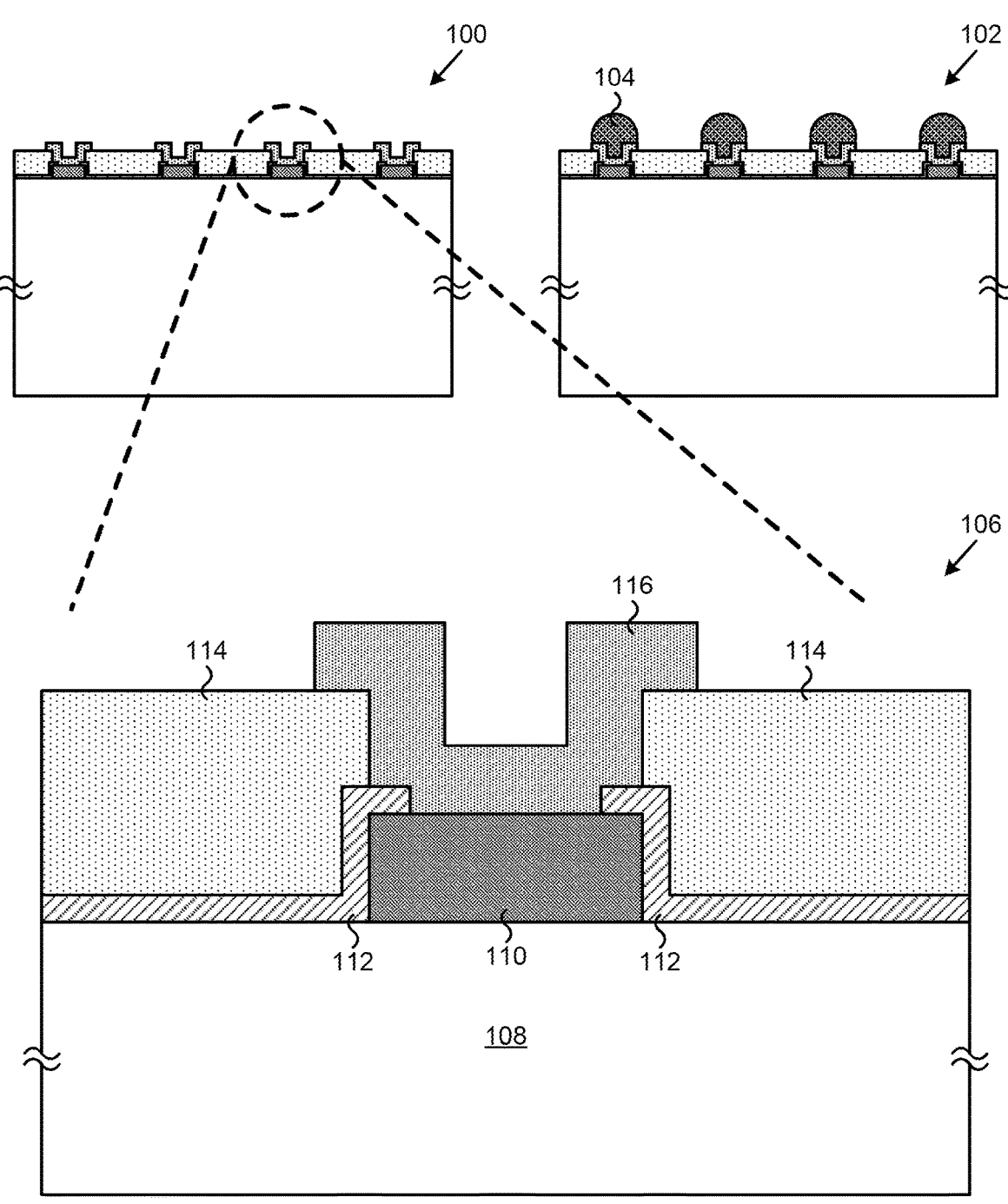
Fig. 1 -- Prior Art --

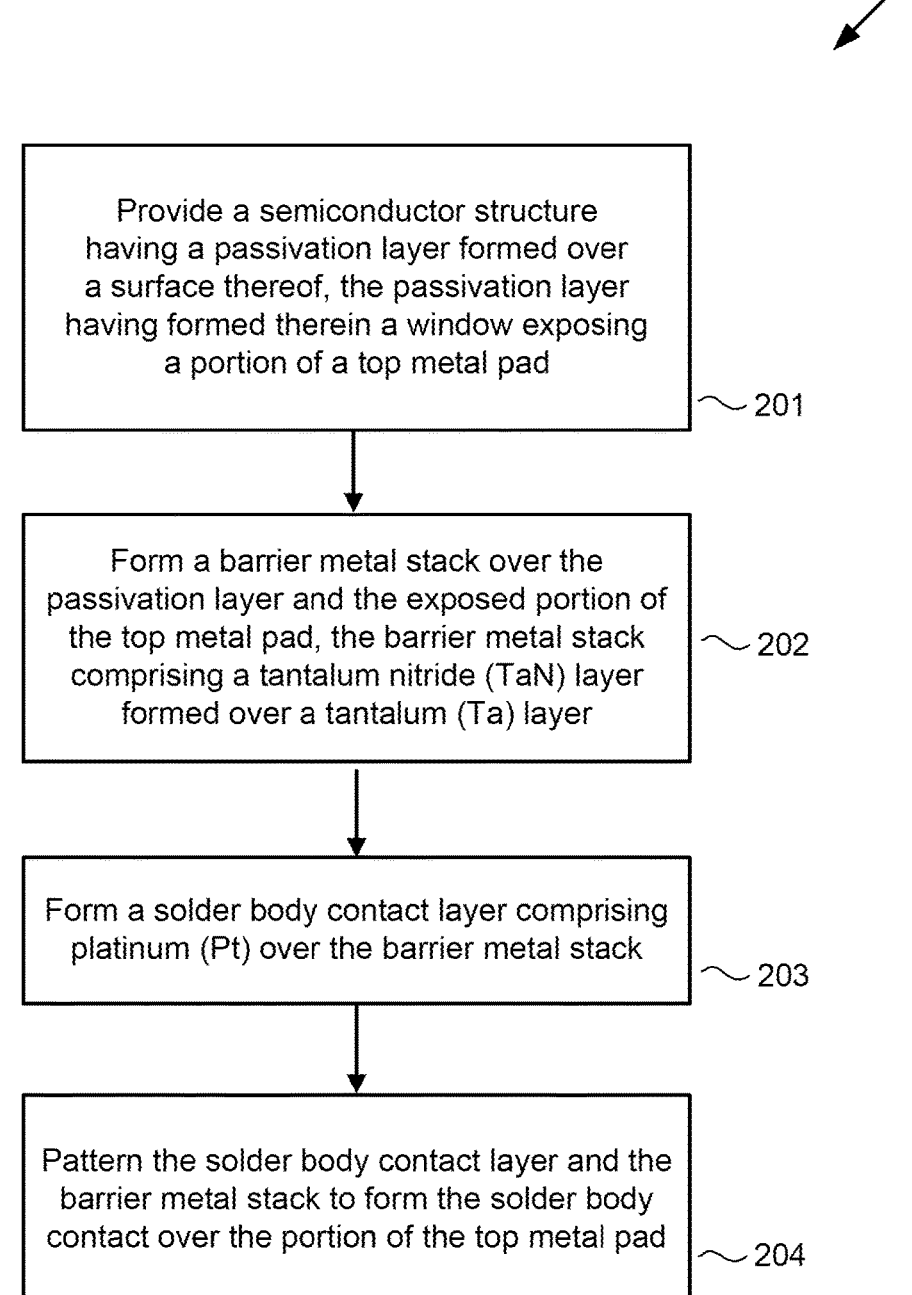

Provide a semiconductor structure
having a passivation layer formed over
a surface thereof, the passivation layer
having formed therein a window exposing
a portion of a top metal pad

201

Form a barrier metal stack over the
passivation layer and the exposed portion of
the top metal pad, the barrier metal stack
comprising a tantalum nitride (TaN) layer
formed over a tantalum (Ta) layer

202

Form a solder body contact layer comprising
platinum (Pt) over the barrier metal stack

203

Pattern the solder body contact layer and the
barrier metal stack to form the solder body
contact over the portion of the top metal pad

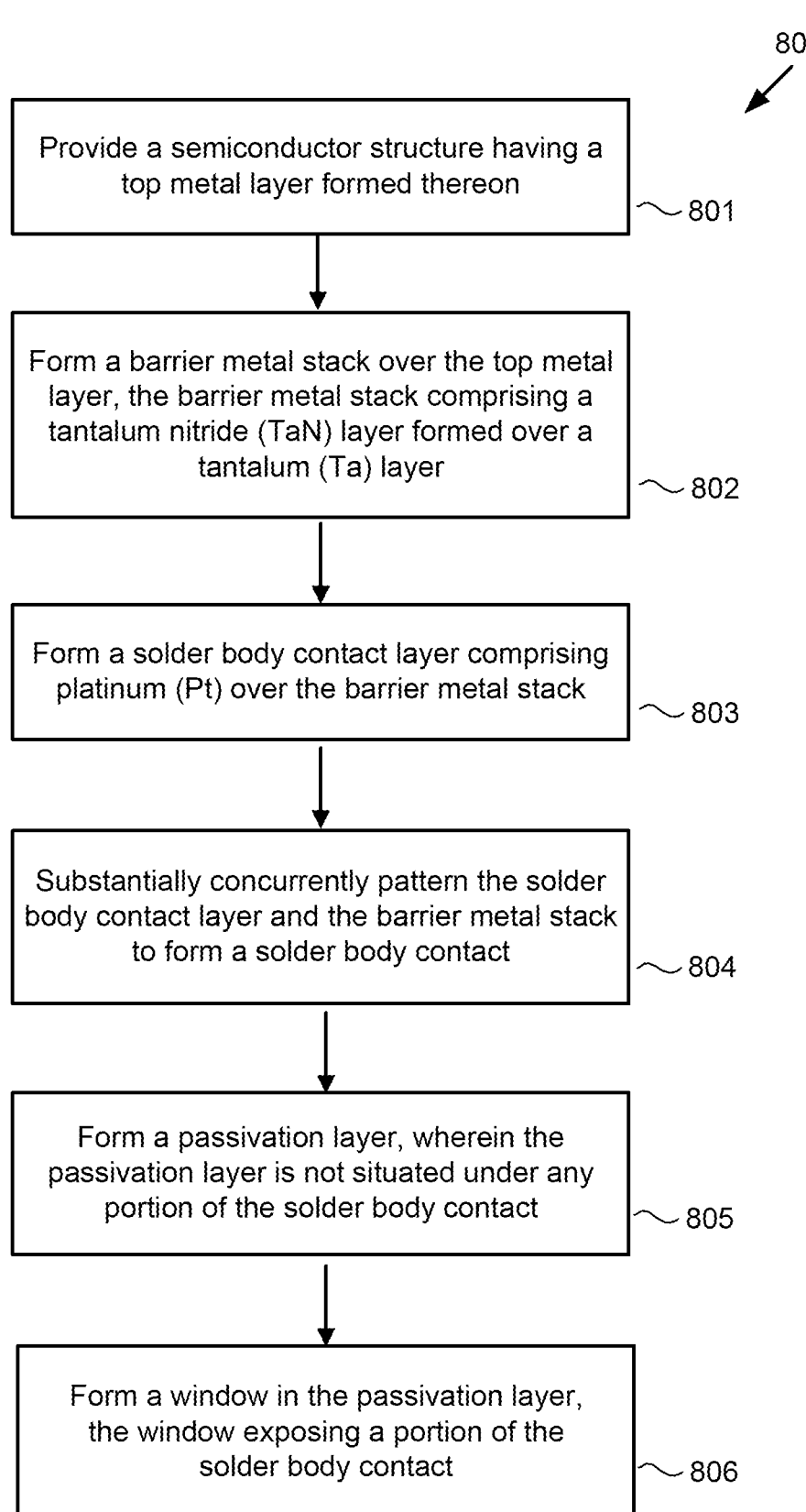

800

Provide a semiconductor structure having a top metal layer formed thereon ~801

Form a barrier metal stack over the top metal layer, the barrier metal stack comprising a tantalum nitride (TaN) layer formed over a tantalum (Ta) layer ~802

Form a solder body contact layer comprising platinum (Pt) over the barrier metal stack ~803

Substantially concurrently pattern the solder body contact layer and the barrier metal stack to form a solder body contact ~804

Form a passivation layer, wherein the passivation layer is not situated under any portion of the solder body contact ~805

Form a window in the passivation layer, the window exposing a portion of the solder body contact ~806

PLATINUM-BASED SOLDER BODY CONTACTS FOR INTEGRATION OF A FIRST SUBSTRATE WITH A SECOND SUBSTRATE

CLAIM OF PRIORITY

The present application is a continuation-in-part of and claims the benefit of and priority to application Ser. No. 17/967,107 filed on Oct. 17, 2022, titled "efficient integration of a first substrate without solder bumps with a second substrate having solder bumps." The disclosure and content of the above-identified application is hereby incorporated fully by reference into the present application.

BACKGROUND

Solder bodies, such as solder bumps for example, are commonly utilized in semiconductor structures to mechanically and electrically connect devices in different substrates. Such connection can assist with pixel readout, signal processing, memory storage, etc. However, a complex, time consuming, and expensive fabrication process is required to provide a processed wafer with solder bodies.

In order to connect to solder bodies, the processed wafer is often equipped with under-bump metallizations (UBMs) over the top interconnect metals to provide metallurgical compatibility with solder bodies. However, UBMs disadvantageously increase fabrication complexity. Forming UBMs in processed wafers adds several processing steps. Due to the types of materials used, the processed wafer is often transferred to a second specialized foundry in order to form UBMs. Overall, forming UBMs and making the processed wafers compatible with solder bodies can add approximately two to three months to the fabrication process.

Although it is possible for solder bodies to be bumped or reflowed directly on a platinum (Pt) metal contact, to form a flip-chip package for example, at the typical silicon backend process temperature of approximately four hundred degrees centigrade (400° C.) Pt can react with the aluminum (Al) often used to provide a top interconnect metal pad. The reaction may undesirably form a Pt—Al intermetallic compound that can affect the strength and reliability of the solder body's attachment to the Pt metal contact. Unfortunately, the barrier metals titanium (Ti) and titanium nitride (TiN) used in many silicon processes have been found to be substantially ineffective in blocking the up-diffusion of Al to reach and react with the Pt metal contact.

Thus, there is a need in the art for a solution for preventing an Al top metal pad from reacting with a Pt metal contact that is situated over the Al top metal pad.

SUMMARY

The present disclosure is directed to platinum-based solder body contacts for integration of a first substrate with a second substrate, substantially as shown in and/or described in connection with at least one of the figures, and as set forth in the claims.

BRIEF DESCRIPTION OF THE DRAWINGS

FIG. 1 illustrates conventional first and second substrates, and an enlarged view of a portion of the first substrate.

FIG. 2 illustrates a flowchart of an exemplary method for forming a semiconductor structure having a platinum-based solder body contact according to one implementation of the present application.

FIG. 8 illustrates a flowchart of an exemplary method for forming a semiconductor structure having a platinum-based solder body contact according to another implementation of the present application.

DETAILED DESCRIPTION

Figure 3:
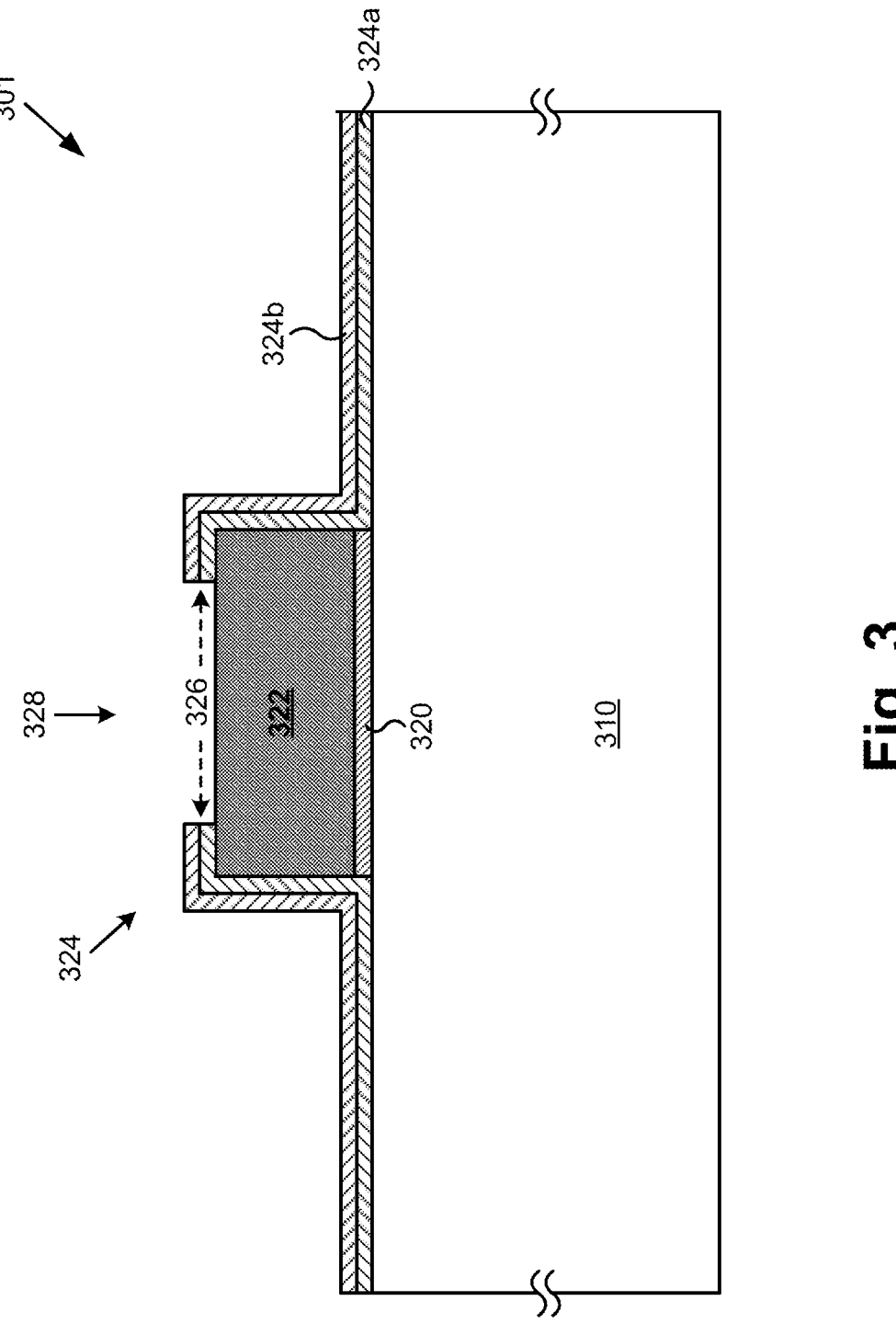
FIG. 3 illustrates a semiconductor structure processed in accordance with the flowchart of FIG. 2 according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates conventional first substrate 100 and second substrate 102, and an enlarged view of first substrate portion 106 of first substrate 100. First substrate 100 and second substrate 102 generally represent any two substrates intended to be electrically and mechanically connected to each other. For example, first substrate 100 can be a photonics substrate, a bipolar complementary metal oxide semiconductor (BiCMOS) substrate, a sensor substrate, a microelectromechanical systems (MEMS) substrate, etc. Second substrate 102 can be an interposer, a printed circuit board (PCB), a microprocessor, a memory device, etc. First substrate 100 and second substrate 102 can include active and passive devices (not shown in FIG. 1).

As shown in FIG. 1, second substrate 102 has second substrate solder bodies 104, shown as solder bumps. In the present implementation, solder bodies are situated on a top side of second substrate 102. Second substrate solder bodies 104 can be any solder bodies known in the art. For example, second substrate solder bodies 104 can be a gold alloy or a silver alloy, such as gold/tin (AuSn) or silver/tin (AgSn). Second substrate solder bodies 104 enable mechanically and electrically connecting second substrate 102 with another semiconductor structure, such as first substrate 100.

However, second substrate solder bodies 104 are generally metallurgically incompatible with top interconnect metals of first substrate 100, as described below. In order to connect first substrate 100 and second substrate 102 using second substrate solder bodies 104, the processed wafer that includes first substrate 100 undergoes an under-bump metallization (UBM) process over the top interconnect metals of the processed wafer. An exemplary portion of substrate 100 is illustrated by first substrate portion 106 in FIG. 1. First substrate portion 106 includes lower substrate region 108, top interconnect metal 110, passivation layer 112, protective layer 114, and UBM 116.

Lower substrate region 108 can include a back-end-of-line (BEOL) multi-level metallization (MLM), and generally any layers of first substrate 100 below top interconnect metal 110. In various implementations, lower substrate region 108 can comprise silicon (Si), silicon-on-insulator (SOI), germanium (Ge), silicon germanium (SixGey), silicon carbide (SixCy), or a group III-V semiconductor. A BEOL MLM can include one or more interlayer metal levels for electrical routing through first substrate 100, and one or more interlayer dielectrics that provide insulation between the interlayer metal levels. Interconnect metals and passive devices can be formed in the interlayer metal levels, and vias can be formed in the interlayer dielectrics. top interconnect metals are the last routing layer. The various layers of lower substrate region 108 are not specifically illustrated in FIG. 1.

Top interconnect metal 110 represents a metal in the last or uppermost interlayer metal level of a BEOL MLM of first substrate 100. For example, top interconnect metal 110 can be a metal from metal level seven (M7) of a BiCMOS substrate, or a metal from metal level three (M3) of a photonics substrate. In various implementations, top interconnect metal 110 can include tungsten (W), aluminum (Al), or copper (Cu).

Passivation layer 112 is situated over top interconnect metal 110 and lower substrate region 108. Passivation layer 112 is an electrically insulating layer. In various implementations, passivation layer 112 can include a semiconductor-based dielectric such as silicon oxide ($Si_xO_Y$), silicon nitride ($Si_xN_Y$), or silicon oxynitride ($Si_xO_YN_Z$). A window in passivation layer 112 exposes a portion of top interconnect metal 110 for electrical connection.

Although first substrate 100 is substantially complete after forming a window in passivation 112, second substrate solder bodies 104 are generally metallurgically incompatible with top interconnect metals 110 of first substrate 100. Metals commonly used in second substrate solder bodies 104 often do not adhere well to metals commonly used in top interconnect metals 110. Low conductivity intermetallics also tend to form at the interface of second substrate solder bodies 104 with top interconnect metals 110. Additionally, low conductivity oxides tend to form at exposed areas of top interconnect metals 110. As a result, first substrate 100 and second substrate 200 cannot be connected at this stage of processing despite that first substrate 100 is substantially complete.

In order to connect first substrate 100 and second substrate 102 using second substrate solder bodies 104, UBMs 116 are formed on first substrate 100 over top interconnect metals 110 and protective layer 114. UBMs 116 provide metallurgical compatibility with second substrate solder bodies 104, and can provide a larger area of exposed metal to facilitate connecting second substrate solder bodies 104. However, UBMs 116 disadvantageously increase fabrication complexity. To form UBMs 116, protective layer 114 is formed over passivation layer 112 and top interconnect metal 110. In various implementations, protective layer 114 can include an organic dielectric or polymer such as polybenzoxazole (PBO), polyimide (PI), or benzocyclobutene (BCB). Protective layer 114 can then be planarized. Then, a mask is formed over protective layer 114. The mask is then utilized to pattern a window in protective layer 114, re-exposing top interconnect metal 110.

Next, a metal layer is deposited over protective layer 114 and in the window over top interconnect metal 110. The metal layer is then patterned to form UBMs 116, for example, by etching or lift-off, which can require an additional mask. In various implementations, UBMs 116 can include a metal that adheres well to and does not oxidize with second substrate solder bodies 104, such as platinum (Pt), nickel (Ni), chromium (Cr), gold (Au), or alloys thereof. The first substrate 100 can then be connected to second substrate 102 by soldering second substrate solder bodies 104 to UBMs 116.

As described above, forming UBMs 116 and making first substrate 100 in a processed wafer compatible with second substrate solder bodies 104 can add several steps to a fabrication process, including two additional deposition steps, two additional masking steps, and two addition patterning steps. Moreover, metals such as Au, Ag, and Cr are typically not used in CMOS foundries, for example, due to risks of device contamination. Accordingly, the processed wafer that includes first substrate 100 is often transferred to a second specialized foundry in order to form UBMs 116 and connect them to second substrate solder bodies 104. Overall, forming UBMs 116 and making first substrate 100 compatible with second substrate solder bodies 104 can add approximately two to three months to the fabrication process.

Figure 4:
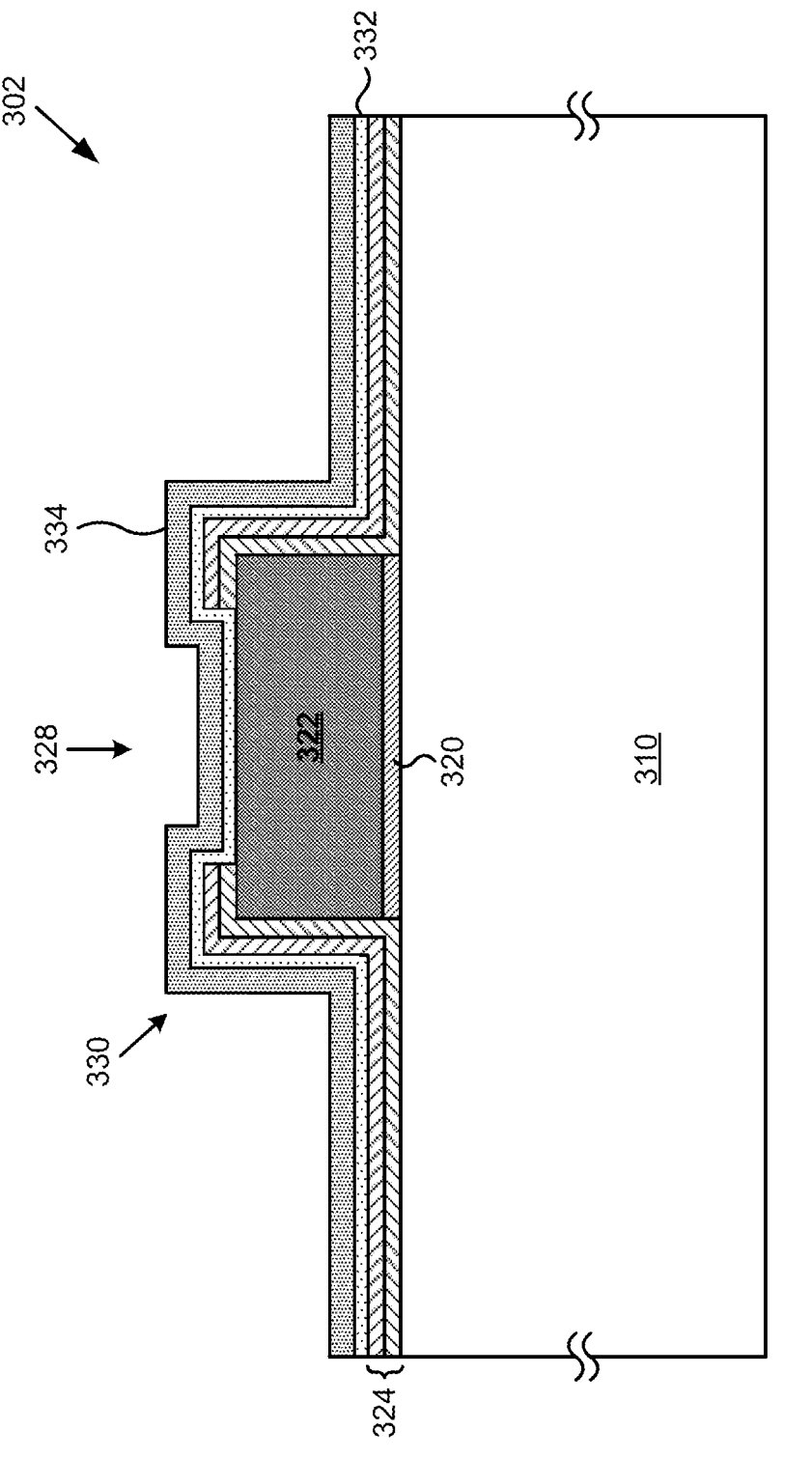
FIG. 4 illustrates a semiconductor structure processed in accordance with the flowchart of FIG. 2 according to one implementation of the present application.

FIG. 2 illustrates a flowchart of an exemplary method for forming a semiconductor structure having a platinum-based solder body contact according to one implementation of the present application. Structures shown in FIGS. 3 through 6 illustrate the results of performing actions 201 through 204 shown in flowchart 200 of FIG. 2. For example, FIG. 3 shows semiconductor structure 301 after performing action 201 in FIG. 2, FIG. 4 shows semiconductor structure 302 after performing action 202 in FIG. 2, and so forth. It is noted that FIG. 7 illustrates a semiconductor structure processed in accordance with the flowchart of FIG. 2 according to another implementation of the present application. It is further noted that semiconductor structures 304 and 704, shown in respective FIGS. 6 and 7, correspond in general to first substrate 100, in FIG. 1, and are configured to receive second substrate solder bodies 104 of second substrate 102.

Actions 201 through 204 shown in flowchart 200 of FIG. 2 are sufficient to describe one implementation of the present inventive concepts. Other implementations of the present inventive concepts may utilize actions different from those shown in the flowchart of FIG. 2. Certain details and features have been left out of flowchart 200 that are apparent to a person of ordinary skill in the art. For example, an action may consist of one or more sub-actions or may involve specialized equipment or materials, as known in the art. Moreover, some actions, such as masking and cleaning actions, are omitted so as not to distract from the illustrated actions.

FIG. 3 illustrates semiconductor structure 301 processed in accordance with action 201 in the flowchart of FIG. 2 according to one implementation of the present application. As shown in FIG. 3, semiconductor structure 301 includes lower substrate region 310, optional barrier metal 320, top metal pad 322, and passivation layer 324 formed over semiconductor lower substrate region 310 and top metal pad 322. As further shown in FIG. 3, passivation layer 324 includes window 326 exposing portion 328 of top metal pad 322.

Lower substrate region 310 in FIG. 3 corresponds in general to lower substrate region 108 in FIG. 1, and may have any implementations described above. Lower substrate region 310 can include a semiconductor wafer, a BEOL MLM, and generally any layers of semiconductor structure 301 below a top metal layer providing top metal pad 322. Top metal pad 322 represents a metal in the last or upper-most interlayer metal level of a BEOL MLM of semiconductor stricture 301. In various implementations, top metal pad 322 can include Al or Cu. In various implementations, top metal pad 322 can have a thickness of approximately one micron (1 μm) to five microns (5 μm).

Optional barrier metal 320 can function to improve adhesion of, or otherwise reduce nonconformities of, top metal pad 322. Optional barrier metal 320 can be formed before and under top metal pad 322. The top metal layer providing top metal pad 322, and optional barrier metal 320, can be provided, for example, by physical vapor deposition (PVD) or chemical vapor deposition (CVD) techniques.

Optional barrier metal 320 can include, for example, titanium (Ti), titanium nitride (TiN), tantalum (Ta), or tantalum nitride (TaN). In various implementations, optional barrier metal 320 can have a thickness of approximately three hundred angstroms (300 Å) to one thousand angstroms (1,000 Å). In various implementations, optional barrier metal 320 can comprise multiple layers. For example, optional barrier metal 320 can comprise a Ti layer having a thickness of approximately three hundred angstroms (300 Å) under a TiN layer having a thickness of approximately six hundred angstroms (600 Å).

The patterning process used to form top metal pad 322 and optional barrier metal 320 may include any metal patterning technique known in the art, such as reactive-ion etching (RIE) or a chemical wet etch, for example. In the present implementation, top metal pad 322 and optional barrier metal 320 are substantially concurrently patterned. As used herein, the expression "substantially concurrently patterned" refers to layers being patterned by the same action without intervening actions such as mask removal or changing etch chemistries, even though an upper layer may technically be finished patterning before a lower layer.

For example, top metal pad 322 and optional barrier metal 320 can be etched down to lower substrate region 310 using a single mask. Accordingly, top metal pad 322 and optional barrier metal 320 can have approximately the same width. As used herein, the expression "approximately the same width" refers to two layers having a similar width, except for normal sidewall angling and other process variations associated with patterning. In other implementations, top metal pad 322 and optional barrier metal 320 may not be concurrently patterned, and can have different widths. As shown in FIG. 3, top metal pad 322 has a width defined by first and second lateral ends, and passivation layer 324 covers those first and second lateral ends while exposing portion 328 of top metal pad 322 through window 326.

Passivation layer 324 can be formed by conformal deposition over first substrate 308, optional barrier metal 320, and top metal pad 322, for example, by PVD or CVD techniques. In various implementations, passivation layer 324 can include a semiconductor-based dielectric such as $Si_XO_Y$, $Si_XN_Y$, or $Si_XO_YN_Z$. In various implementations, passivation layer 324 can have a thickness of approximately fifty angstroms (50 Å) to two hundred angstroms (200 Å).

In the present implementation, passivation layer 324 comprises multiple passivation layers 324a and 324b. In one implementation, passivation layer 324a can comprise a $Si_XO_Y$ layer having a thickness of approximately twenty five angstroms (25 Å) to one hundred angstroms (100 Å) under passivation layer 324b that can comprise a $Si_XN_Y$ layer having a thickness of approximately twenty five angstroms (25 Å) to one hundred angstroms (100 Å). Thus, in various implementations, passivation layer 324 may comprise an oxide layer and/or a nitride layer. Moreover, it is noted that in some implementations, passivation layer 324 does not comprise PBO, PI, or BCB.

As shown in FIG. 3, window 326 in passivation layer 324 exposes portion 328 of top metal pad 322 at a bottom surface of passivation layer 324 (i.e., where the bottom surface of passivation layer 324 interfaces the top surface of top metal pad 322). Window 326 can be formed in passivation layer 324 by patterning passivation layer 324. For example, an isotropic dry plasma etch using sulfur hexafluoride (SFS) can be utilized to form window 326. In one implementation, the width of window 326 is approximately twenty-five microns (25 μm).

FIG. 4 illustrates semiconductor structure 302 processed in accordance with action 202 in the flowchart of FIG. 2 according to one implementation of the present application. As shown in FIG. 4, semiconductor structure 302 includes barrier metal stack 330 formed over passivation layer 324 and portion 328 of top metal pad 322 exposed by window 326 in passivation layer 324. Barrier metal stack 330 includes Ta layer 332 and TaN layer 334 formed over Ta layer 332.

Barrier metal stack 330 may be formed using a physical deposition process. For example, Ta layer 332 may be formed by sputtering Ta onto passivation layer 324 and portion 328 of top metal pad 322. Thereafter, nitrogen (N) gas may be introduced into the chamber in which sputtering of Ta continues to occur, resulting in formation of TaN layer 334 over Ta layer 332. That is to say, Ta layer 332 and TaN layer 334 of barrier metal stack 330 may be formed successively in the same chamber.

Ta layer 332 of barrier metal stack 330 may be formed so as to have a thickness of between approximately fifty angstroms (50 Å) and three hundred angstroms (300 Å). TaN layer 334 of barrier metal stack 330 may be formed so as to have a thickness of between approximately three hundred angstroms (300 Å) and approximately two thousand angstroms (2000 Å).

Figure 5:
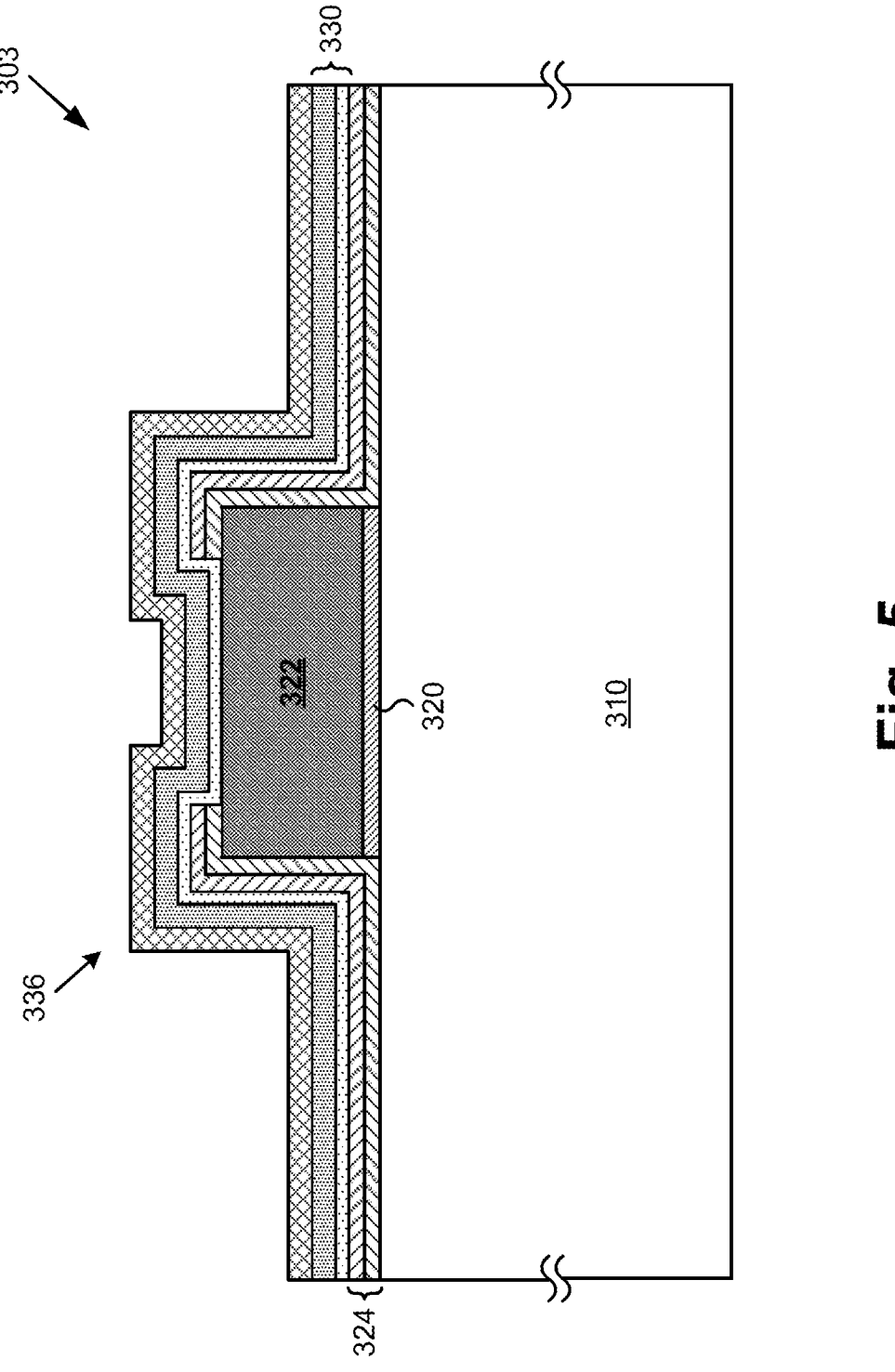
FIG. 5 illustrates a semiconductor structure processed in accordance with the flowchart of FIG. 2 according to one implementation of the present application.

FIG. 5 illustrates semiconductor structure 303 processed in accordance with action 203 in the flowchart of FIG. 2 according to one implementation of the present application. As shown in FIG. 5, semiconductor structure 303 includes solder body contact layer 336 formed over barrier metal stack 330.

Solder body contact layer 336 comprises a material metallurgically compatible with a second substrate solder body (not shown in FIG. 5), such that a portion of solder body contact layer 336 of semiconductor structure 303 is capable of electrically and mechanically connecting to second substrate solder bodies 104 of second substrate 102 (shown in FIG. 1). Preferably, solder body contact layer 336 comprises a material that adheres well to metals commonly used in solder bodies, and that eliminates or significantly reduces formation of low conductivity intermetallics at an interface with the solder bodies. The material also preferably eliminates or significantly reduces formation of low conductivity oxides at areas exposed to air.

In one implementation, solder body contact layer 336 comprises Pt. In various implementations, solder body contact layer 336 may be a layer of platinum or a layer of a platinum alloy. Solder body contact layer 336 can have a thickness of approximately one hundred angstroms (100 Å) to one thousand angstroms (1,000 Å).

Figure 6:
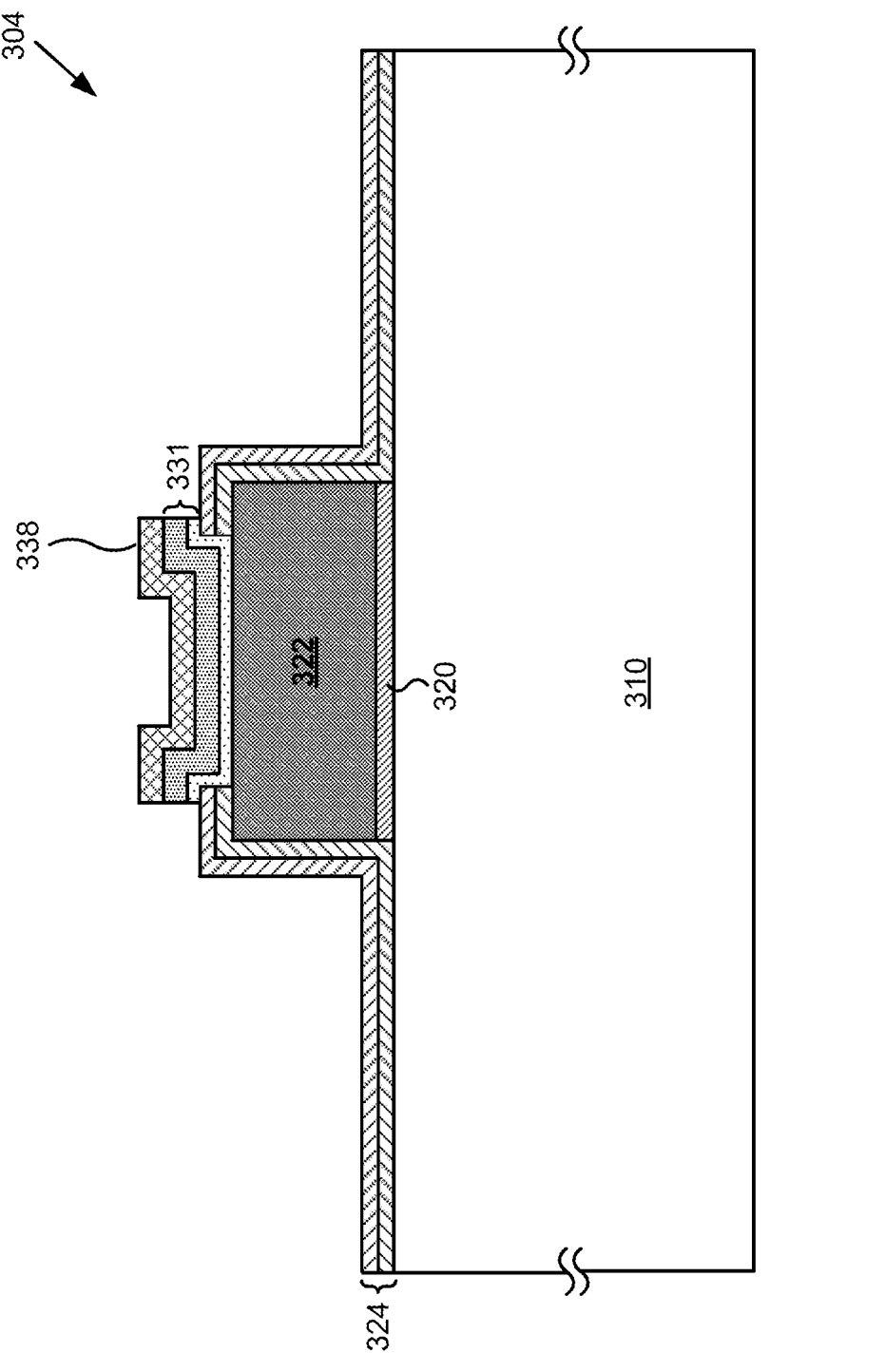
FIG. 6 illustrates a semiconductor structure processed in accordance with the flowchart of FIG. 2 according to one implementation of the present application.
Figure 7:
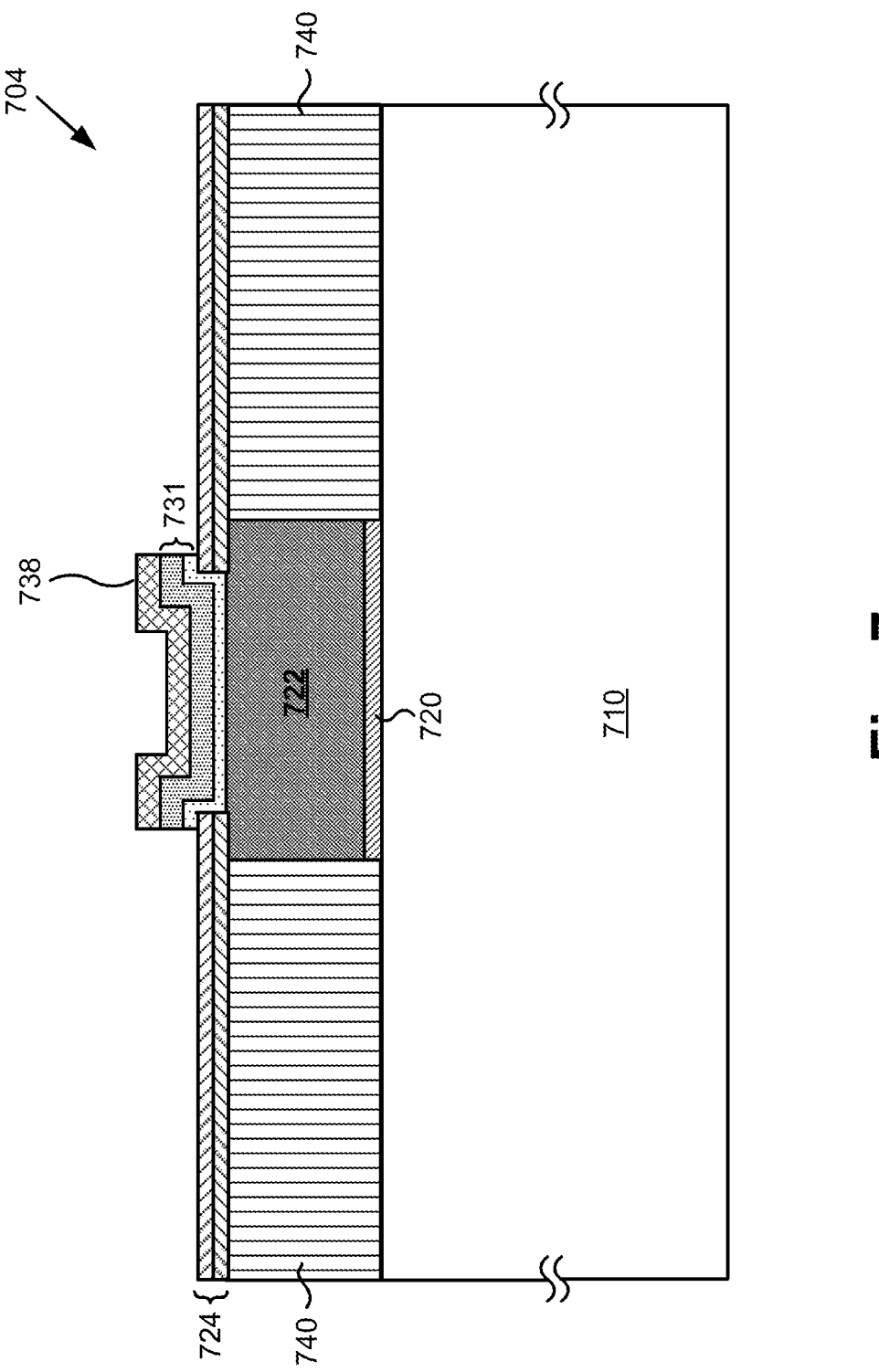
FIG. 7 illustrates a semiconductor structure processed in accordance with the flowchart of FIG. 2 according to another implementation of the present application.

FIG. 6 illustrates semiconductor structure 304 processed in accordance with action 204 in the flowchart of FIG. 2 according to one implementation of the present application. As shown in FIG. 6, solder body contact layer 336 (shown in FIG. 5) and barrier metal stack 330 (also shown in FIG. 5) are patterned to form solder body contact 338 and patterned barrier metal stack 331 over top metal pad 322.

Patterning of solder body contact 338 and patterned barrier metal stack 331 can utilize any metal patterning technique known in the art, such as REI or a chemical wet etch, for example. In the present implementation, solder body contact 338 and patterned barrier metal stack 331 are substantially concurrently patterned. As noted above, the expression "substantially concurrently patterned" refers to layers being patterned by the same action without intervening actions such as mask removal or changing etch chemistries, even though an upper layer may technically be finished patterning before a lower layer.

For example, solder body contact 338 and patterned barrier metal stack 331 can be etched down to passivation layer 324 using a single mask. Accordingly, solder body contact 338 and patterned barrier metal stack 331 can have approximately the same width, as that characterization is described above. The width can be chosen such that solder body contact 338 is slightly wider than the second substrate solder bump it is supposed to receive. In one implementation, the width of solder body contact 338 is approximately thirty microns (30 μm). In other implementations, solder body contact 338 and patterned barrier metal stack 331 may not be concurrently patterned, and can have different widths.

As noted above by reference to FIG. 3, top metal pad 322 has a width defined by first and second lateral ends, and passivation layer 324 covers those first and second lateral ends while exposing portion 328 of top metal pad 322 through window 326. According to the exemplary implementation shown in FIG. 6, patterning of solder body contact layer 336 and barrier metal stack 330 forms solder body contact 338 over portion 328 of top metal pad 322 and over the first and second lateral ends of top metal pad 322 also covered by passivation layer 324.

FIG. 7 illustrates semiconductor structure 704 processed in accordance with the flowchart of FIG. 2 according to another implementation of the present application. As shown in FIG. 7, semiconductor structure 704 includes lower substrate region 710, optional barrier metal 720, top metal pad 722, dielectric regions 740, and passivation layer 724, as well as patterned barrier metal stack 731 and solder body contact 738 formed over top metal pad 722.

Lower substrate region 710, optional barrier metal 720, top metal pad 722, and passivation layer 724 correspond respectively in general to lower substrate region 310, optional barrier metal 320, top metal pad 322, and passivation layer 324, in FIGS. 3 through 6. Consequently, lower substrate region 710, optional barrier metal 720, top metal pad 722, and passivation layer 724 may share any of the characteristics attributed to respective lower substrate region 310, optional barrier metal 320, top metal pad 322, and passivation layer 324 by the present disclosure.

In addition, patterned barrier metal stack 731 and solder body contact 738, in FIG. 7, correspond respectively in general to patterned barrier metal stack 331 and solder body contact 338, in FIG. 6. Thus, patterned barrier metal stack 731 and solder body contact 738 may share any of the characteristics attributed to patterned barrier metal stack 331 and solder body contact 338 by the present disclosure.

Semiconductor structure 704 differs from semiconductor structure 304 in that semiconductor structure 704 includes dielectric regions 740, which result in semiconductor structure 704 having a planar surface in contrast to the non-planar surface of semiconductor structure 304. Dielectric regions 740 may be formed of any suitable electrical insulator. In one implementation, for example, dielectric regions 740 may be formed of deposited $Si_xO_Y$.

Semiconductor structures 304 and 704 are substantially complete after forming respective solder body contacts 338 and 738 over respective top metal pads 322 and 722. The solder body contacts 338 and 738 are generally metallurgically compatible with second substrate solder bump 104 (shown in FIG. 1). As a result, semiconductor structures 304 and 704 are capable of electrically and mechanically connecting to second substrate 102 (also shown in FIG. 1).

Semiconductor structures according to the present invention, such as semiconductor structure 304 in FIG. 6 and semiconductor structure 704 in FIG. 7, result in numerous advantages, some of which are stated below. First, semiconductor structures 304 and 704 greatly simplify the fabrication process. In contrast to first substrate 100 in FIG. 1 that can add two additional deposition steps, two additional masking steps, and two addition patterning steps, semiconductor structures 304 and 704 only add a single additional deposition step (as shown in FIG. 5), a single additional masking step, and a single additional patterning step (additional masking and patterning steps resulting in semiconductor structures 304 and 704 shown in respective FIGS. 6 and 7). Furthermore, a deposition step for a protective layer, such as an organic dielectric or polymer, can be omitted.

Second, solder body contacts 338 and 738, and passivation layer 324 and 724 can comprise materials typically used in CMOS foundries. Thus, semiconductor structures 304 and 704 can omit metals, such as Au, Ag, and Cr, and organic dielectrics or polymers, such as PBO, PI, or BCB, which may not be readily available in a CMOS foundry. Accordingly, semiconductor structures 304 and 704 need not be transferred to a second specialized foundry in order to make semiconductor structures 304 and 704 compatible with second substrate solder bodies 104 of second substrate 102 (shown in FIG. 1).

Third, as a corollary to the first and second advantages above, semiconductor structures 304 and 704 can reduce fabrication time, approximately on the scale of months. Fourth, solder body contacts 338 and 738 can prevent oxidation during transfer of semiconductor structures 304 and 704 prior to connection to second substrate solder bodies 104. Fifth, solder body contacts 338 and 738 are compatible with a variety of solder bumping techniques, including both flip-chip and wire bonding techniques. Sixth, by omitting rather large layers like protective layer 114 and UBM 116 (shown in FIG. 1), the form factor of semiconductor structures 304 and 704 and the pitch of solder body contacts 338 and 738 is generally reduced.

Figure 9:
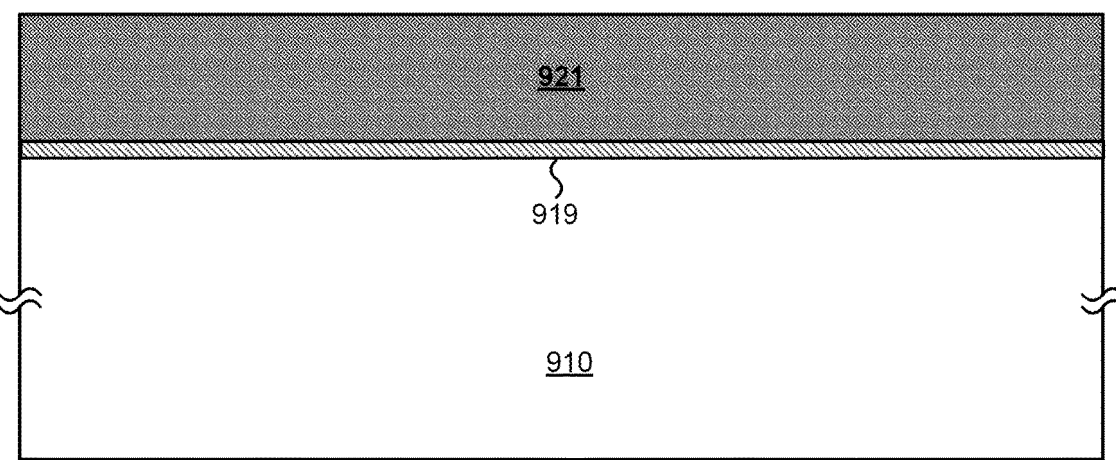
FIG. 9 illustrates a semiconductor structure processed in accordance with the flowchart of FIG. 8 according to one implementation of the present application.
Figure 10:
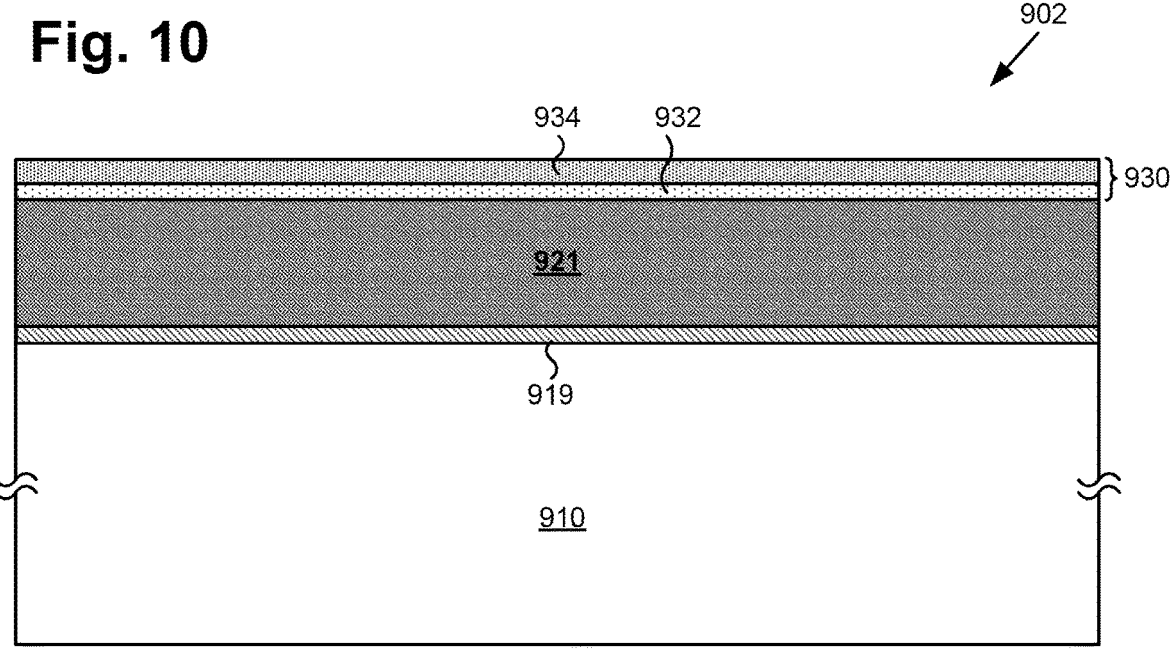
FIG. 10 illustrates a semiconductor structure processed in accordance with the flowchart of FIG. 8 according to one implementation of the present application.

Referring to FIG. 8, FIG. 8 illustrates a flowchart of an exemplary method for forming a semiconductor structure having a platinum-based solder body contact according to another implementation of the present application. Structures shown in FIGS. 9 through 14 illustrate the results of performing actions 801 through 806 shown in flowchart 800 of FIG. 8. For example, FIG. 9 shows semiconductor structure 901 after performing action 801 in FIG. 8, FIG. 10 shows semiconductor structure 902 after performing action 802 in FIG. 8, and so forth. It is noted that semiconductor structure 906, shown in FIG. 14, corresponds in general to first substrate 100, in FIG. 1, and is configured to receive second substrate solder bodies 104 of second substrate 102.

Actions 801 through 806 shown in flowchart 800 of FIG. 8 are sufficient to describe one implementation of the present inventive concepts. Other implementations of the present inventive concepts may utilize actions different from those shown in the flowchart of FIG. 8. Certain details and features have been left out of flowchart 800 that are apparent to a person of ordinary skill in the art. For example, an action may consist of one or more sub-actions or may involve specialized equipment or materials, as known in the art. Moreover, some actions, such as masking and cleaning actions, are omitted so as not to distract from the illustrated actions.

FIG. 9 illustrates semiconductor structure 901 processed in accordance with action 801 in the flowchart of FIG. 8 according to one implementation of the present application. As shown in FIG. 9, semiconductor structure 901 includes lower substrate region 910, top interconnect metal layer 921 (hereinafter "top metal layer 921"), and optional barrier metal layer 919.

Lower substrate region 910 in FIG. 9 generally corresponds to lower substrate region 108 in FIG. 1, and may have any implementations described above. Lower substrate region 910 can include a semiconductor wafer, a BEOL MLM, and generally any layers of semiconductor structure 901 below top metal layer 921. Top metal layer 921 represents a metal in the last or uppermost interlayer metal level of a BEOL MLM of semiconductor structure 901. In various implementations, top metal layer 921 can include Al or copper Cu. In various implementations, top metal layer 921 can have a thickness of approximately one micron (1 μm) to five microns (5 μm).

Optional barrier metal layer 919 can function to improve adhesion of, or otherwise reduce nonconformities of, top metal layer 921. Optional barrier metal layer 919 can be formed before and under top metal layer 921. Top metal layer 921 and optional barrier metal layers 320a and 320b can be provided, for example, by PVD or CVD techniques.

Optional barrier metal layer 919 can include, for example, Ti, TiN, Ta, or tantalum TaN. In various implementations, optional barrier metal layer 919 can have a thickness of approximately three hundred angstroms (300 Å) to one thousand angstroms (1,000 Å). In various implementations, optional barrier metal layer 919 can comprise multiple layers. For example, optional barrier metal layer 919 can comprise a Ti layer having a thickness of approximately three hundred angstroms (300 Å) under a TiN layer having a thickness of approximately six hundred angstroms (600 Å).

FIG. 10 illustrates semiconductor structure 902 processed in accordance with action 802 in the flowchart of FIG. 8 according to one implementation of the present application. As shown in FIG. 10, semiconductor structure 902 includes barrier metal stack 930 formed over top metal layer 921. Barrier metal stack 930 includes Ta layer 932 and TaN layer 934 formed over Ta layer 932.

Barrier metal stack 930 may be formed using a physical deposition process. For example, Ta layer 932 may be formed by sputtering Ta onto top metal layer 921. Thereafter, nitrogen (N) gas may be introduced into the chamber in which sputtering of Ta continues to occur, resulting in formation of TaN layer 934 over Ta layer 932. That is to say, Ta layer 932 and TaN layer 934 of barrier metal stack 930 may be formed successively in the same chamber.

Ta layer 932 of barrier metal stack 930 may be formed so as to have a thickness of between approximately fifty angstroms (50 Å) and three hundred angstroms (300 Å). TaN layer 934 of barrier metal stack 930 may be formed so as to have a thickness of between approximately three hundred angstroms (300 Å) and approximately two thousand angstroms (2000 Å).

Figure 11:
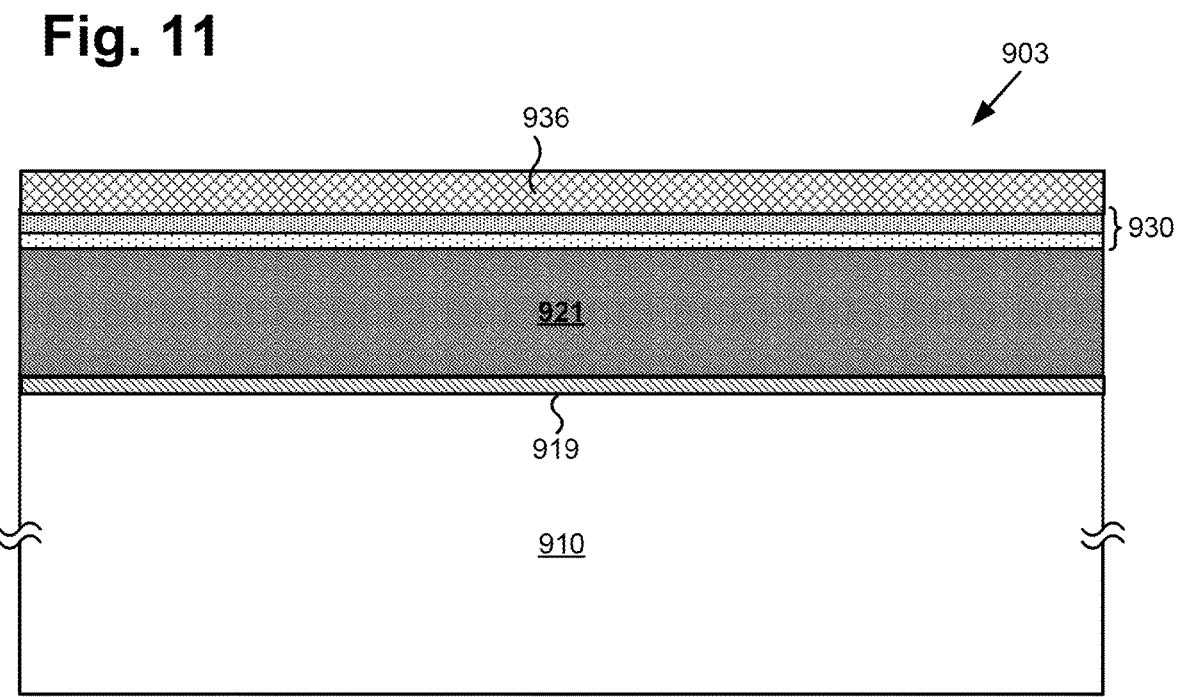
FIG. 11 illustrates a semiconductor structure processed in accordance with the flowchart of FIG. 8 according to one implementation of the present application.

FIG. 11 illustrates semiconductor structure 903 processed in accordance with action 803 in the flowchart of FIG. 8 according to one implementation of the present application. As shown in FIG. 11, semiconductor structure 903 includes solder body contact layer 936 formed over barrier metal stack 930.

Solder body contact layer 936 comprises a material metallurgically compatible with a second substrate solder body (not shown in FIG. 11), such that a portion of solder body contact layer 936 of semiconductor structure 903 is capable of electrically and mechanically connecting to the second substrate solder body. Preferably, solder body contact layer 936 comprises a material that adheres well to metals commonly used in solder bodies, and that eliminates or significantly reduces formation of low conductivity intermetallics at an interface with solder bodies. The material also preferably eliminates or significantly reduces formation of low conductivity oxides at areas exposed to air.

In one implementation, solder body contact layer 936 comprises Pt. In various implementations, solder body contact layer 936 may be a layer of platinum or a layer of a platinum alloy. In various implementations, solder body contact layer 936 can have a thickness of approximately one hundred angstroms (100 Å) to one thousand angstroms (1,000 Å).

Figure 12:
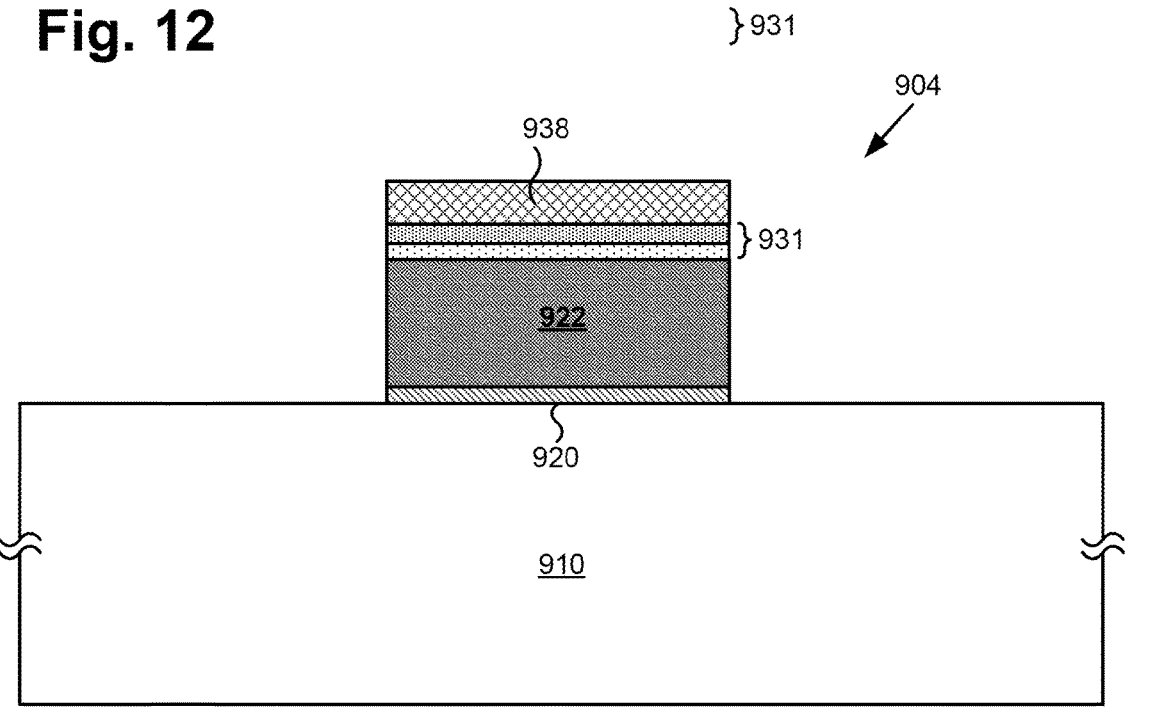
FIG. 12 illustrates a semiconductor structure processed in accordance with the flowchart of FIG. 8 according to one implementation of the present application.

FIG. 12 illustrates semiconductor structure 904 processed in accordance with action 804 in the flowchart of FIG. 8 according to one implementation of the present application. As shown in FIG. 12, solder body contact layer 936, barrier metal stack 930, and top metal layer 921 (all shown in FIG. 11) are patterned to form solder body contact 938 over top metal pad 922. Optional barrier metal layer 919 is also patterned to form optional barrier metal 920.

Patterning solder body contact 938, patterned barrier metal stack 931, top metal pad 922, and optional barrier metal 920 in FIG. 12 can utilize any metal patterning technique known in the art, such as RIE or a chemical wet etch, for example. In the present implementation, solder body contact 938, patterned barrier metal stack 931, top metal pad 922, and optional barrier metal 920 are substantially concurrently patterned. As noted above, the expression "substantially concurrently patterned" refers to layers being patterned by the same action without intervening actions such as mask removal or changing etch chemistries, even though an upper layer may technically be finished patterning before a lower layer.

For example, the metal stack including solder body contact 938, patterned barrier metal stack 931, top metal pad 922, and optional barrier metal 920 can be etched down to lower substrate region 910 using a single mask. Accordingly, solder body contact 938, patterned barrier metal stack 931, top metal pad 922, and optional barrier metal 920 can have approximately the same width. As further noted above, the expression "approximately the same width" refers to two layers having a similar width, except for normal sidewall angling and other process variations associated with patterning. The width can be chosen such that solder body contact 938 is slightly wider than the second substrate solder body it is supposed to receive. In one implementation, the width of solder body contact 938 is approximately thirty microns (30 μm). In other implementations, solder body contact 938, patterned barrier metal stack 931, top metal pad 922, and optional barrier metal 920 are not concurrently patterned, and can have different widths.

Figure 13:
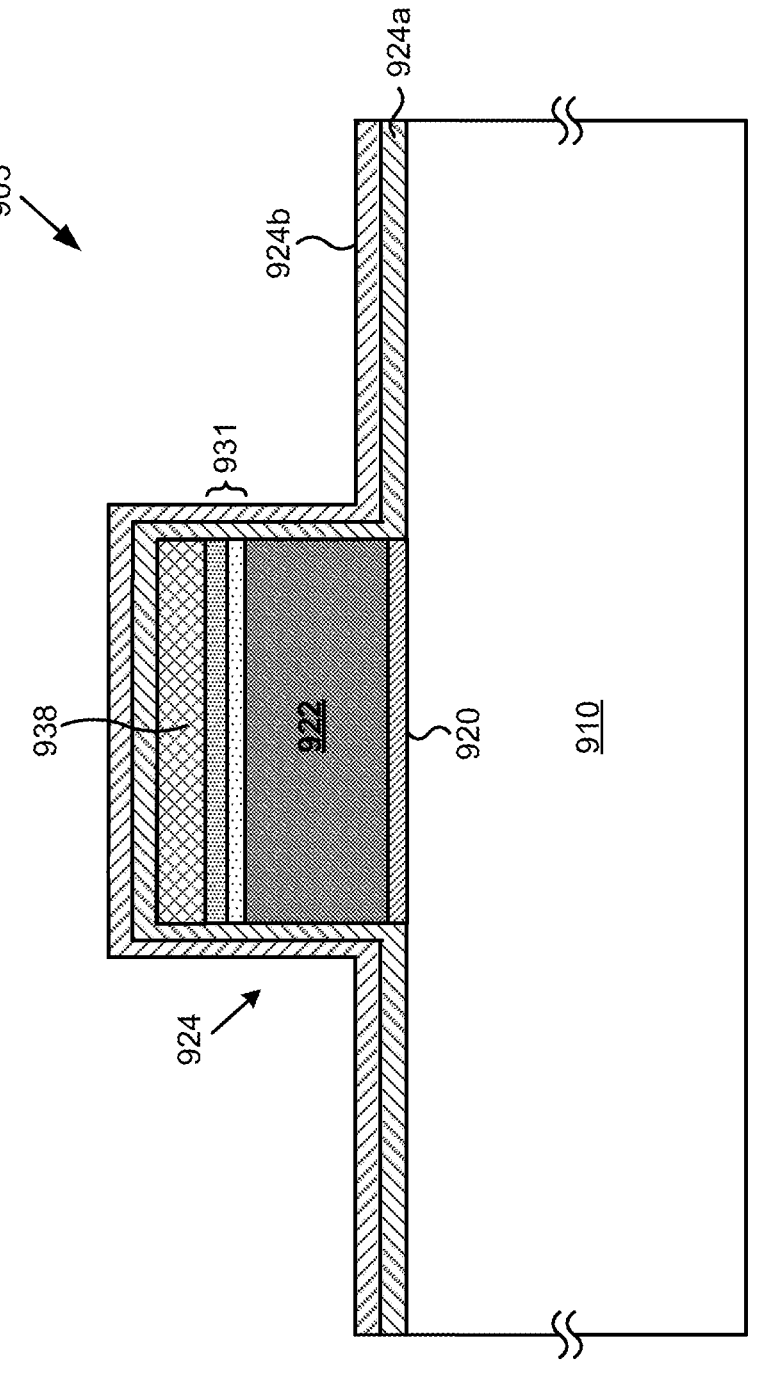
FIG. 13 illustrates a semiconductor structure processed in accordance with the flowchart of FIG. 8 according to one implementation of the present application.

FIG. 13 illustrates semiconductor structure 905 processed in accordance with action 805 in the flowchart of FIG. 8 according to one implementation of the present application. As shown in FIG. 13, passivation layer 924 is formed, wherein passivation layer 924 is not situated under any portion of solder body contact 938.

Passivation layer 924 is formed over solder body contact 938, on sidewalls of the patterned metal stack solder body contact 938, patterned barrier metal stack 931, top metal pad 922, and optional barrier metal 920, and over lower substrate region 910. Passivation layer 924 can be formed by conformal deposition over semiconductor structure 904 (shown in FIG. 12), for example, by physical vapor PVD or chemical CVD techniques. In various implementations, passivation layer 924 can include a semiconductor-based dielectric such as $Si_xO_Y$, $Si_xN_Y$, or $Si_xO_YN_Z$. In various implementations, passivation layer 924 can have a thickness of approximately fifty angstroms (50 Å) to two hundred angstroms (200 Å).

In the present implementation, passivation layer 924 comprises multiple passivation layers 924*a* and 924*b*. In one implementation, passivation layer 924*a* can comprise a $Si_xO_Y$ layer having a thickness of approximately twenty five angstroms (25 Å) to one hundred angstroms (100 Å) under passivation layer 924*b* that can comprise a $Si_xN_Y$ layer having a thickness of approximately twenty five angstroms (25 Å) to one hundred angstroms (100 Å). Thus, in various implementations, passivation layer 924 may comprise an oxide layer and/or a nitride layer. Moreover, it is noted that in some implementations, passivation layer 924 does not comprise PBO, PI, or BCB.

Notably, solder body contact 938 is formed prior to and lies under passivation layer 924. As such, passivation layer 924 is not situated under any portion of solder body contact 938. Rather, passivation layer 924 is situated over and on the sidewalls of solder body contact 938. It is noted that passivation layer 924 "not situated under any portion of" solder body contact 938 in FIG. 13 refers to passivation layer 924 not being under solder body contact 938 along a vertical axis, in an orientation semiconductor structure 904 in FIG. 12 would have when passivation layer 924 is formed (e.g., the orientation with lower substrate region 910 down and top metal pad 922 up).

Referring to FIGS. 13 and 1 in combination, in contrast to semiconductor structure 905 in FIG. 13, in first substrate portion 106 in FIG. 1, UBM 116 is formed after and over both protective layer 114 and passivation layer 112. As such, both protective layer 114 and passivation layer 112 are situated under portions of UBM 116.

Figure 14:
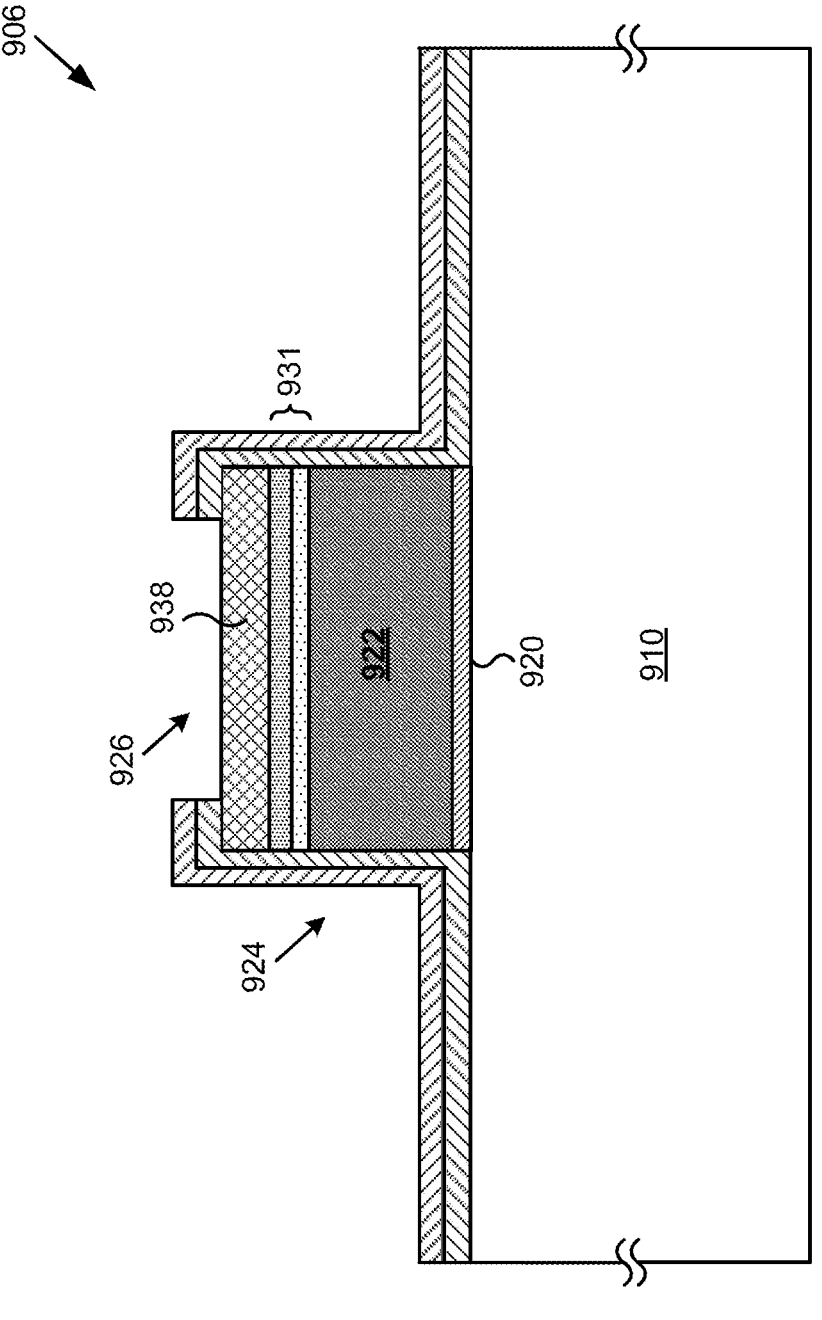
FIG. 14 illustrates a semiconductor structure processed in accordance with the flowchart of FIG. 8 according to one implementation of the present application.

FIG. 14 illustrates semiconductor structure 906 processed in accordance with action 806 in the flowchart of FIG. 8 according to one implementation of the present application. As shown in FIG. 14, window 926 is formed in passivation layer 924, exposing a portion of solder body contact 938.

As shown in FIG. 14, window 926 exposes a portion of solder body contact 938 at a bottom surface of passivation layer 924 (i.e., where the bottom surface of passivation layer 924 interfaces the top surface of solder body contact 938).

Window 926 can be formed in passivation layer 924 by patterning passivation layer 924. For example, an isotropic dry plasma etch using sulfur hexafluoride ($SF_6$) can be utilized to form window 926. The width of window 926 can be chosen such that solder body contact 938 is slightly wider than the second substrate solder bump it is supposed to receive. In one implementation, the width of window 926 is approximately twenty-five microns (25 μm).

Semiconductor structure 906 in FIG. 14 is substantially complete after forming window 926. The exposed portion of solder body contact 938 is generally metallurgically compatible with second substrate solder bump 104 (shown in FIG. 1). As a result, semiconductor structure 906 is capable of electrically and mechanically connecting to second substrate 102 (also shown in FIG. 1).

Semiconductor structures according to the present invention, such as semiconductor structure 906 in FIG. 14, result in numerous advantages, some of which are stated below. First, semiconductor structure 906 greatly simplifies the fabrication process. In contrast to first substrate 100 in FIG. 1 that can add two additional deposition steps, two additional masking steps, and two addition patterning steps, semiconductor structure 906 in FIG. 9 only adds one deposition step (as shown in FIG. 11). A deposition step for a protective layer, such as an organic dielectric or polymer, can be omitted. No additional masking steps are needed and no additional etching steps are needed, since the metal stack including solder body contact 938, patterned barrier metal stack 931, top metal pad 922, and optional barrier metal 920 can be substantially concurrently patterned (as shown in FIG. 12).

Second, solder body contact 938 and passivation layer 924 can comprise materials typically used in CMOS foundries. Semiconductor structure 906 can omit metals, such as Au, Ag, and Cr, and organic dielectrics or polymers, such as PBO, PI, or BCB, which may not be readily available in a CMOS foundry. Accordingly, semiconductor structure 906 need not be transferred to a second specialized foundry in order to make semiconductor structure 906 compatible with second substrate solder bodies 104 of second substrate 102 (shown in FIG. 1).

Third, as a corollary to the first and second advantages above, semiconductor structure 906 can reduce fabrication time, approximately on the scale of months. Fourth, solder body contact 938 can prevent oxidation during transfer of semiconductor structure 906 prior to connection to second substrate solder bodies 104. Fifth, solder body contact 938 is compatible with a variety of solder bumping techniques, including both flip-chip and wire bonding techniques. Sixth, by omitting rather large layers like protective layer 114 and UBM 116 (shown in FIG. 1), the form factor of semiconductor structure 906 and the pitch of solder body contact 938 is generally reduced.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A method comprising:

providing a semiconductor structure having a passivation layer over a surface thereof, said passivation layer having a window exposing a portion of a top metal pad;

forming a barrier metal stack over said passivation layer and said portion of said top metal pad, said barrier metal stack comprising a tantalum nitride (TaN) layer and a tantalum (Ta) layer;

forming a solder body contact layer comprising platinum (Pt) over said barrier metal stack;

patterning said solder body contact layer and said barrier metal stack to form a solder body contact over said portion of said top metal pad.

2. The method of claim 1, wherein said top metal pad has first and second lateral ends, and wherein said passivation layer covers said first and second lateral ends while exposing said portion of said top metal pad.

3. The method of claim 2, wherein said patterning said solder body contact layer and said barrier metal stack forms said solder body contact over said portion of said top metal pad and over said first and second lateral ends.

4. The method of claim 1, wherein said solder body contact layer is one of a Pt layer or a platinum alloy layer.

5. The method of claim 1, wherein said top metal pad is an aluminum (Al) pad or a copper (Cu) pad.

6. The method of claim 1, wherein said passivation layer comprises an oxide layer and/or a nitride layer.

7. The method of claim 1, wherein said passivation layer does not comprise polybenzoxazole (PBO), polyimide (PI), or benzocyclobutene (BCB).

8. A method comprising:

providing a semiconductor structure having a top metal layer formed thereon;

forming a barrier metal stack over said top metal layer, said barrier metal stack comprising a tantalum nitride (TaN) layer and a tantalum (Ta) layer;

forming a solder body contact layer comprising platinum over said barrier metal stack;

substantially concurrently patterning said solder body contact layer and said barrier metal stack to form a solder body contact.

9. The method of claim 8, further comprising:

forming a passivation layer, wherein said passivation layer is not situated under any portion of said solder body contact;

forming a window in said passivation layer, said window exposing a portion of said solder body contact.

10. The method of claim 9, wherein said passivation layer comprises an oxide layer and/or a nitride layer.

11. The method of claim 9, wherein said passivation layer does not comprise polybenzoxazole (PBO), polyimide (PI), or benzocyclobutene (BCB).

12. The method of claim 8, wherein said solder body contact layer is one of a Pt layer or a platinum alloy layer.

13. The method of claim 8, wherein said top metal layer is an aluminum (Al) layer or a copper (Cu) layer.

14. A semiconductor structure comprising:

a passivation layer formed over a surface of said semiconductor structure, said passivation layer having a window exposing a portion of a top metal pad;

a patterned barrier metal stack formed over said top metal pad in said window, said patterned barrier metal stack comprising a tantalum nitride (TaN) segment formed over a tantalum (Ta) segment;

a solder body contact comprising platinum (Pt) formed over said patterned barrier metal stack.

15. The semiconductor structure of claim 14, wherein said top metal pad has first and second lateral ends, and wherein said passivation layer is situated over said first and second lateral ends while exposing said portion of said top metal pad.

16. The semiconductor structure of claim 14, wherein said solder body contact is situated over said portion of said top metal pad and over said first and second lateral ends.

17. The semiconductor structure of claim 14, wherein said solder body contact is one of a Pt contact or a platinum alloy contact.

18. The semiconductor structure of claim 14, wherein said top metal pad is an aluminum (Al) pad or a copper (Cu) pad.

19. The semiconductor structure of claim 14, wherein said passivation layer comprises an oxide layer and/or a nitride layer.

20. The semiconductor structure of claim 14, wherein said passivation layer does not comprise polybenzoxazole (PBO), polyimide (PI), or benzocyclobutene (BCB).

* * * * *